United States Patent [19]
Takebuchi et al.

[11] Patent Number: 6,078,074
[45] Date of Patent: Jun. 20, 2000

[54] SEMICONDUCTOR DEVICE HAVING MULTILAYER METAL INTERCONNECTION

[75] Inventors: Masataka Takebuchi, Yokosuka; Seiichi Mori, Tokyo; Yoshiharu Hirata, Yokohama, all of Japan

[73] Assignee: Kabushiki Kaisha Toshiba, Kawasaki, Japan

[21] Appl. No.: 08/985,182

[22] Filed: Dec. 4, 1997

[30] Foreign Application Priority Data

Dec. 6, 1996 [JP] Japan .................................. 8-327075

[51] Int. Cl.[7] ............................ H01L 29/76; H01L 29/88; H01L 29/792
[52] U.S. Cl. ............................ 257/316; 257/314; 257/324
[58] Field of Search .................................. 257/314–324, 257/758, 659–670; 438/257–264

[56] References Cited

U.S. PATENT DOCUMENTS

| | | | |
|---|---|---|---|
| 4,892,840 | 1/1990 | Esquivel et al. | 257/316 |
| 5,151,761 | 9/1992 | Takebuchi | 257/758 |
| 5,338,969 | 8/1994 | Kaya | 257/659 |
| 5,365,103 | 11/1994 | Brown et al. | 257/758 |

*Primary Examiner*—Minh Loan Tran
*Assistant Examiner*—Cuong Q Nguyen
*Attorney, Agent, or Firm*—Banner & Witcoff, Ltd.

[57] ABSTRACT

An n-type diffused layer is formed in a p-type semiconductor substrate. A control gate electrode of a memory cell MC is connected with a metal interconnect of a first layer and the metal interconnect is connected with the diffused layer. Moreover, a metal interconnect of the first layer is connected with a metal interconnect of a second layer. An interconnect of the second layer is connected with the output node of a row decoder.

12 Claims, 5 Drawing Sheets

SEMICONDUCTOR DEVICE HAVING MULTILAYER METAL INTERCONNECTION

BACKGROUND OF THE INVENTION

The present invention relates to a semiconductor device having a multilayer metal interconnection structure and a method of manufacturing the same.

In a non-volatile semiconductor memory device having a double gate structure, which is constructed with a floating gate and control gate electrode in a stacking manner, the control gate is used as a word line and a row of a memory array is selected by a signal from the word line. Generally, an end of the word line made of polycrystal silicon is disconnected at a position where no memory cell is present and the other end is connected to the output node of a row decoder. In a non-volatile semiconductor memory device having a double-layer metal interconnection structure, a metal interconnect of a first layer is connected to the word line through a contact hole in an area outside a memory cell region on the side where the word line is connected to the output node of the decoder and a metal interconnect of a second layer is connected to a metal interconnect of the first layer through a via-hole, and a metal interconnect of the second layer is connected to the output node of a row decoder.

The above mentioned interconnects of the first and second layers each are formed by the following steps of: forming a hole in an interlayer insulating film locating on the lower side of each of the interconnects by RIE (reactive ion etching), depositing a metal all over the surface of each interlayer insulating film; and forming a pattern from the metal.

FIG. 1 is a sectional view showing a semiconductor device in a step of manufacture in the case where a metal interconnect of a first layer is formed; thereafter an interlayer insulating film is deposited on the metal interconnect; and then a via-hole is formed in the interlayer insulating film by RIE. In the figure, 61 indicates a metal interconnect of a first layer, 62 indicates an interlayer insulating film formed on the metal interconnect 61, 63 indicates a via-hole formed in the interlayer insulating film 62 by a RIE step, and 64 indicates a mask layer for etching. A metal interconnect 61 of the first layer is used as a word line of a memory cell and a memory cell MC wherein control gate electrode is connected to the metal interconnect 61 is symbolically shown as well.

A metal interconnect 61 of the first layer is charged with electricity by fluctuation of a plasma when the via-hole 63 is formed by etching in the RIE step. Since the metal interconnect 61 of the first layer is connected to the control gate electrode of the memory cell MC, a high voltage is imposed to the control gate electrode of the memory cell.

In the RIE step, a back gate (substrate) is fixedly set at a constant voltage, for example at the ground potential. For this reason, a high voltage is also imposed between the floating gate and the substrate by division based on capacitances between the control gate electrode and floating gate electrode and between the floating gate electrode and the substrate. A gate insulating film present between the floating gate electrode and the substrate is generally thinner than a gate insulating film present between the control gate electrode and floating gate electrode. For this reason, the gate insulating film between the floating gate electrode and substrate has a fear to be subjected to electrical breakdown by having the above mentioned high voltage imposed. The breakdown is thought to be caused by a charging damage due to fluctuation of a plasma during a step of boring the via-hole.

In the future of a non-volatile semiconductor memory device, a gate insulating film is further thinned according to the scaling rule and a plasma density is also in an increasing trend, so that the problems are more conspicuous, as mentioned above.

There has been a problem, heretofore, that, when a hole is formed by a RIE step, said hole being used for connection between metal interconnects of a multilayer structure, a metal interconnect of a lower layer is electrically charged by a charging damage and a gate insulation breakdown of a transistor occurs, wherein the gate electrode of the transistor is connected to the metal interconnect of a lower layer.

BRIEF SUMMARY OF THE INVENTION

The present invention has been made in consideration of the above mentioned situation and it is an object of the present invention to provide a semiconductor device which can prevent a electrical breakdown of a gate insulating film caused by a charging damage in a RIE step.

According to the present invention, there is provided a semiconductor device comprising: a first semiconductor region of a first conductive type; a transistor including a gate electrode provided on a channel region located between a source and drain regions with an insulating film interposing therebetween; interconnects of at least two layers, which are made of conductive layers above the gate electrode, which are electrically connected to the gate electrode, and which are mutually connected with each other; and a connecting part for electrically connecting a part at an arbitrary position in an interconnecting route between the interconnects of at least two layers and the gate electrode with the first semiconductor region.

According to the present invention, there is provided a semiconductor memory device comprising: a first semiconductor region of a first conductive type; a memory cell array wherein the memory cell array includes a plurality of transistors including a gate electrode provided on a channel region located between a source and drain regions with an insulating film interposing therebetween, the transistors are arranged in rows and columns each as a memory cell, and gate electrodes of memory cells in the same row is connected with each other so as to be all in common continuity and work as a word line; interconnects of at least two layers, which are made of conductive layers above the word line, which are electrically connected with the word line, and which are mutually connected with each other; and a connecting part for electrically connecting a part at an arbitrary position in an interconnecting route between the interconnects of at least two layers and the word line with the first semiconductor region.

According to the present invention, there is provided a non-volatile semiconductor memory device comprising: a first semiconductor region of a first conductive type; a memory cell array wherein the memory cell array includes a plurality of transistors including a floating gate electrode provided on a channel region located between a source and drain regions with a first insulating film interposing therebetween, and a control gate electrode provided on the floating gate electrode with a second insulating film interposing therebetween, the transistors are arranged in rows and columns each as a memory cell, and gate electrodes of memory cells in the same row is connected with each other so as to be all in common continuity and work as a word line; interconnects of at least two layers, which are made of conductive layers above the word line, which are electrically connected with the word line, and which are mutually connected with each other; and a connecting part for electrically connecting a part at an arbitrary position in an interconnecting route between the interconnects of at least two layers and the word line with the first semiconductor region.

According to the present invention, there is provided a method of manufacturing a semiconductor device comprising the steps of: preparing a semiconductor substrate of a first conductive type; forming a gate electrode on a channel region located between a source and drain regions with a first insulating film interposing therebetween to complete a transistor; forming a second diffused layer of a second conductive type in such a relation that it is isolated from the source and drain regions at the same time when they are formed in the semiconductor substrate; forming a second insulating film all over the surface; thereafter forming a first hole communicating with a surface of the gate electrode and a second hole communicating with a surface of the second diffused layer in the second insulating film respectively; forming a first interconnect electrically connecting the surface of the gate electrode with the surface of the second diffused layer through the first and second holes; forming a third insulating film all over the surface; forming a third hole communicating with a surface of the first interconnect in the third insulating film by a selective etching method using RIE; and forming a second interconnect in such a manner that the third hole may be buried.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will below be described in embodiments in reference to the accompanying drawings.

Figure 1:
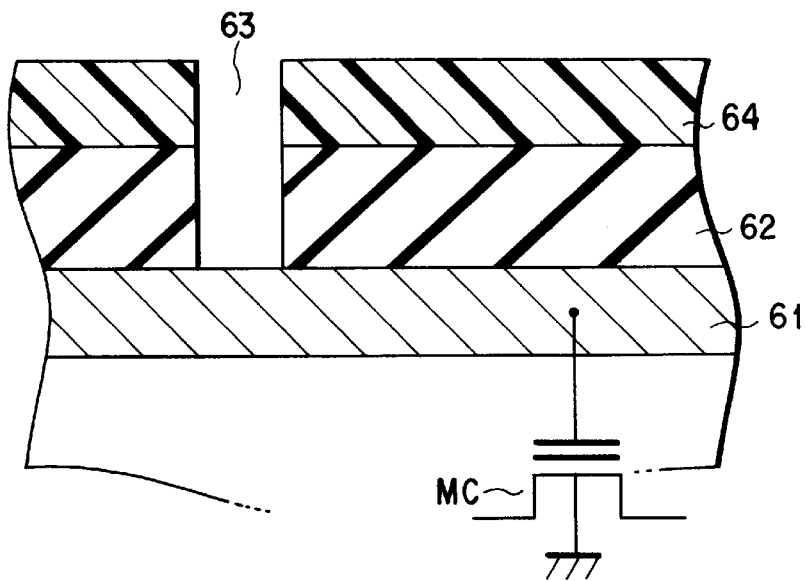
FIG. 1 is a sectional view showing a semiconductor device in a step of manufacture in the case where a hole formed is in an interlayer insulating film on whose lower side a metal interconnection is formed.
Figure 2:
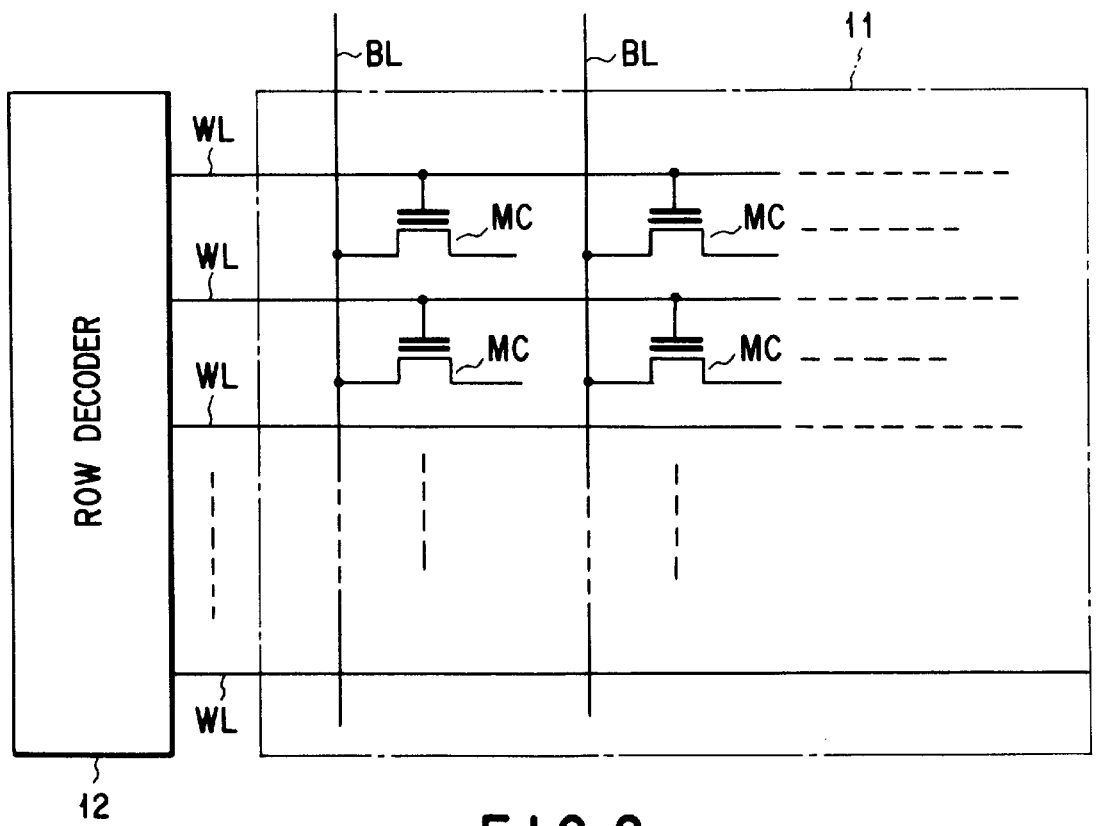
FIG. 2 is a block diagram showing a configuration in the vicinity of a memory cell array in the case where the present invention is executed in a nonvolatile semiconductor device.

FIG. 2 is a block diagram showing a circuit configuration in the vicinity of a memory cell array in the case where the present invention is executed in a non-volatile semiconductor memory device. A plurality of memory cells MC are arranged in rows and columns in a memory cell array 11. Each memory cell MC comprises a transistor having a double gate structure, which is constructed with floating gate and control gate electrodes in a stacking manner. Control gates of a plurality of memory cells MC arranged along a row direction of the memory cell array 11 (a lateral direction in the figure) are used as a word line WL and the memory array 11 is selected when an output from a row decoder 12 is given to the word line WL.

On the other hand, drains of a plurality of memory cells MC arranged along a column direction (a longitudinal direction in the figure) of the memory cell MC array 11 are connected to bit lines BL so as to be in a common continuity and, when data is read and written, read and write signals are given to and returned from each memory cell through each bit line BL.

The ground potential is generally given to the source of each memory cell MC, though it is not shown in the figure.

Figure 3A:
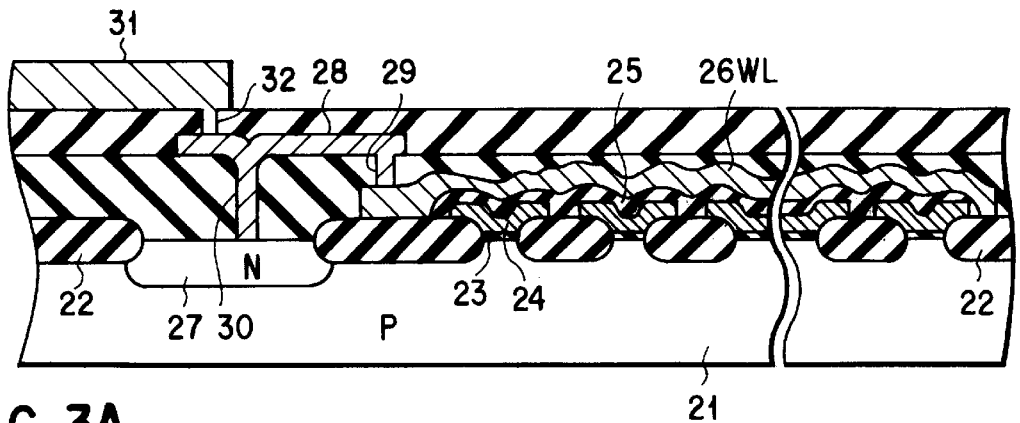
FIGS. 3A and 3B are a sectional view and an equivalent circuit diagram showing a row of memory cells and a control gate electrode of a non-volatile semiconductor memory device of FIG. 2 according to a first embodiment of the present invention.
Figure 3B:
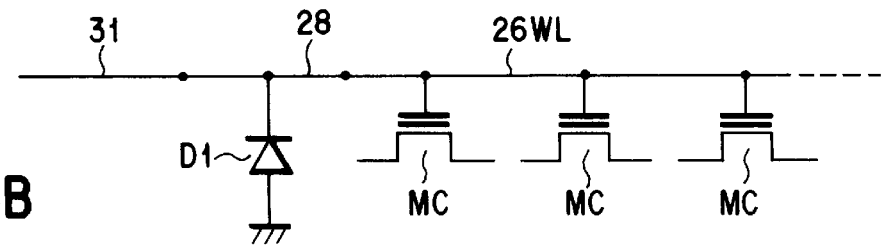

FIGS. 3A and 3B are a sectional view and an equivalent circuit diagram showing a row of memory cells and a control gate electrode (word line WL) connected with the row of memory cells MC so as to be in common continuity of a non-volatile semiconductor memory device of FIG. 2.

A field insulating film 22 for a device isolation is formed on a semiconductor substrate 21 having a p-type conductivity by means of a thermal oxidation method. On each element region surrounded by the field insulating film 22, there are deposited the first gate insulating film 23 of each memory cell MC, a floating gate electrode 24 made of polycrystal silicon, a second gate insulating film 25 and a control gate electrode 26 (word line WL) made of polycrystal silicon. The first gate insulating film 23 and second gate insulating film 25 are silicon oxide films respectively formed, for example, by means of a thermal oxidation method or a CVD method, wherein a thickness of the first gate insulating film 23 is, for example, in the range of 10 nm to 15 nm and a thickness of the second gate insulating film 25 is, for example, in the range of 20 nm to 25 nm.

In each element region, there are formed source and drain regions which are made of a diffused layer having a conductivity type contrary to the substrate, that is, an n-type conductivity and each floating gate electrode 24 mentioned above is formed on a channel region located between the source and drain region.

The control gate electrode 26 (word line WL) is extended over a plurality of memory cells MC in electrical connection with each of them and an end thereof is electrically disconnected at a position where no memory cell is available. Besides, in a element region located at the other end side of the control gate electrode 26 there is formed a diffused layer 27 having a conductivity type contrary to the substrate, that is, an n-type conductivity. The diffused layer 27 may be formed at the same time when the source and drain region are formed, or before or after the source and drain region are formed in a separate step. A metal layer of a first layer, for example a metal interconnect 28 of a first layer, which is a first layer, made of aluminum, is formed with an interlayer insulating film made of PSG or BPSG interposing therebetween. The metal interconnect 28 is electrically connected with the other end of the control gate electrode 26 through a contact hole 29 already formed in the interlayer insulating film and electrically connected with a surface of the diffused layer 27 through a second contact hole 30 already formed in the interlayer insulating film as well. Besides, a metal layer of second layer, for example, a metal interconnect 31 of a second layer made of aluminum, is formed above the metal interconnect 28 with a second interlayer insulating film, for example, made of PSG or BPSG, interposing therebetween and the interconnect 31 is electrically connected with the metal interconnect 28 through a via-hole 32 already formed in the second interlayer insulating film. The metal interconnect 31 of the second layer is connected with the output node of the row decoder.

In such a constitution, the control gate electrode 26 (word line WL) is connected with the output node of the row decoder shown in FIG. 2 through metal interconnects 28, 31 respectively of the first and second layers, and a part of the metal interconnect 28 of the first layer, in the connecting route between the metal interconnects 28, 31 respectively of the first and second layers, and the control gate electrode 26 is electrically connected with the n-type diffused layer 27 formed in the p-type semiconductor substrate 21.

The p-type semiconductor substrate 21 and n-type diffused layer 27 constitute a junction diode Dl, as shown in FIG. 3B.

In such a constitution, the p-type semiconductor substrate 21 is fixed at the ground potential in RIE when the via-hole 32 which communicates with the metal interconnect 28 of the first layer is formed in the second interlayer insulating film. For this reason, a charging current with a negative polarity, which is produced when fluctuation of a plasma occurs during RIE of the second interlayer insulating film, is let to flow away through the junction diode D1 to the ground potential. As a result, a high voltage, which is caused by the fluctuation of a plasma, is not imposed on the control gate electrode of each memory cell MC and a breakdown in a gate insulating film, especially the first gate insulating film 23 having a thickness as thin as in the range 10 nm to 15 nm, between the floating gate electrode 24 and the substrate (the channel region) can be prevented.

Figure 4A:
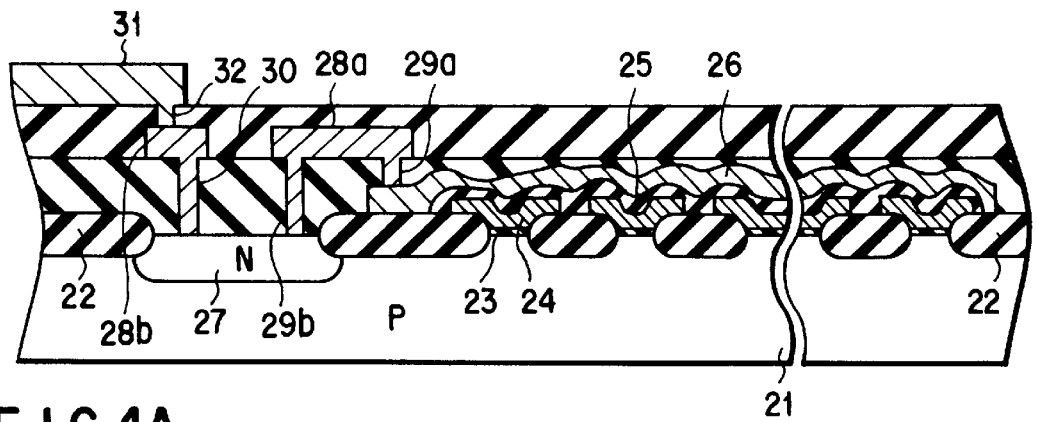
FIGS. 4A and 4B are a sectional view and an equivalent circuit diagram showing a row of memory cells and a control gate electrode of a non-volatile semiconductor memory device of FIG. 2 according to a second embodiment of the present invention.
Figure 4B:
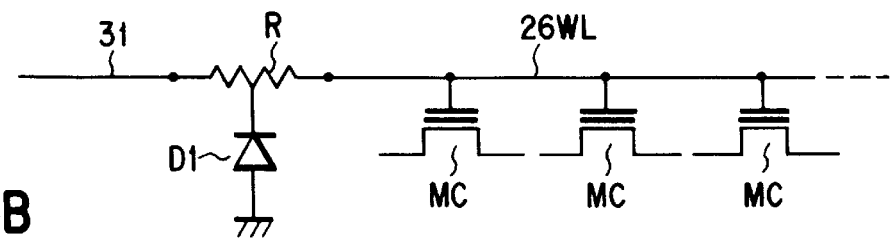

FIGS. 4A and 4B are a sectional view and an equivalent circuit diagram showing a row of memory cells and a control gate electrode (word line WL), which is communicated with the memory cells MC in a common continuity of a non-volatile semiconductor memory device of FIG. 2.

Points at which this embodiment is different from that of FIGS. 3A and 3B are that the metal interconnection 28 of the first layer, is divided into two metal interconnects 28a and 28b. A metal interconnect 28a is electrically connected not only with the other end of the control gate electrode 26 through a contact hole 29a formed in the interlayer insulating film but also with the surface of the diffused layer 27 through a second contact hole 29b formed in the interlayer insulating film. A second metal interconnect 28b is electrically connected with the surface of a part different from the connecting part between the metal interconnect 28a and the diffused layer 27 through a third contact hole 30 formed in the interlayer insulating film. The metal interconnect 31 of the second layer, is electrically connected with the second metal interconnect 28b through a via-hole 32 formed in the second interlayer insulating film. Description of the other constitution is omitted, since it is similar to the case of FIG. 3A.

In such a constitution, the control gate electrode 26 (word line WL) is connected with the output node of the row decoder shown in FIG. 2 through the metal interconnect 28a of the first layer, the diffused layer 27, the metal interconnect 28b of the first layer and the metal interconnect 31 of the second layer. Besides, a part of the metal interconnect 28a, 28b of the first layer, in a connecting route between the metal interconnects 28a, 28b respectively of the first and second layers and the control gate electrode 26, is electrically connected with the n-type layer 27 formed in the p-type semiconductor substrate 21.

A resistance R caused by the diffused layer 27 is inserted between the metal interconnects 28a, 28b of the first layer, in addition to the junction diode D1 as shown in the equivalent circuit diagram of FIGS. 4B. since positions, at which the contact holes 29b, 30 are located, is different from each other as shown in FIG. 4A, said contact holes 29b, 30 communicating the metal interconnects 28a, 28b of the first layer with the diffused layer 27 and being respectively formed in the interlayer insulating film.

According to such a constitution, the p-type semiconductor substrate 21 is fixed at the ground potential in RIE when the via-hole 32 is bored in the second interlayer insulating film, said via-hole 32 communicating with the metal interconnect 28b of the first layer. For this reason, a charging current with a negative polarity, which is produced when fluctuation of a plasma occurs in RIE, is let to flow away to the ground potential through the junction diode D1. Moreover, the charging current flows into the diffused layer 27 without fail through the metal interconnect 28b of the first layer, and thereby an effect that a charging current is let to flow away is more secured. As a result, a high voltage, which is caused by the fluctuation of a plasma, is not imposed on the control gate electrode of each memory cell MC any longer and a breakdown in a gate insulating film, especially the first gate insulating film 23 as thin as in the range of 10 to 15 nm, between the floating gate electrode 24 and substrate (channel region) can be prevented.

Figure 5A:
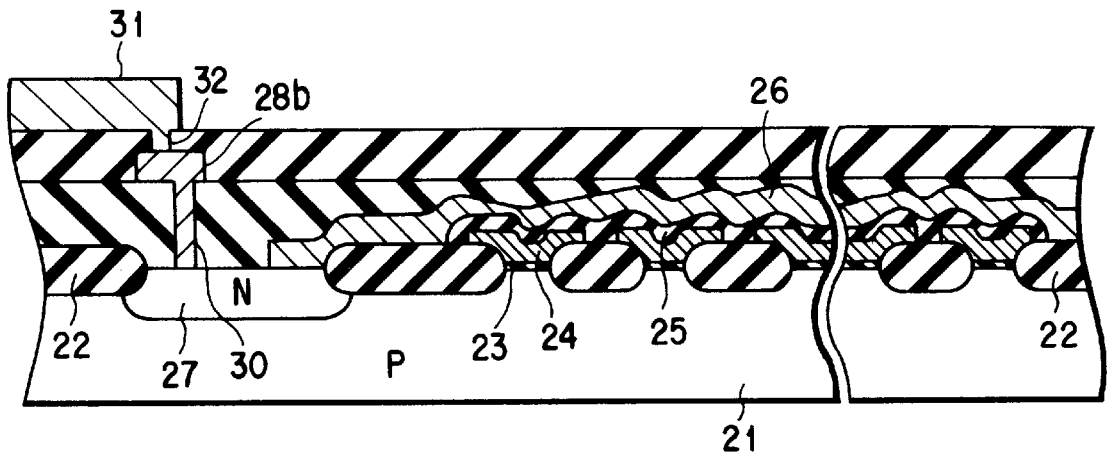
FIGS. 5A and 5B are a sectional view and an equivalent circuit diagram showing a row of memory cells and a control gate electrode of a non-volatile semiconductor memory device of FIG. 2 according to a third embodiment of the present invention.
Figure 5B:
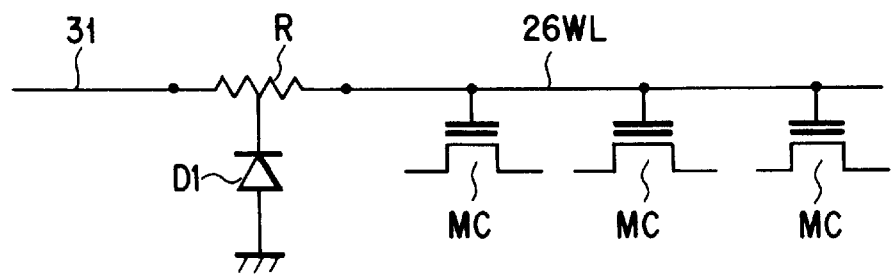

FIGS. 5A and 5B are a sectional view and an equivalent circuit diagram showing a row of memory cells MC and a control gate electrode (word line WL), which is communicated with the memory cells MC in a common continuity of a non-volatile semiconductor memory device of FIG. 2.

Points at which this embodiment is different from that of FIGS. 4A, 4B are that the control gate electrode 26 (word line WL) is directly connected, that is to say a so-called "direct contact" is employed, with the diffused layer 27 by extending the control gate electrode 26 (word line WL) to above the diffused layer 27 in stead of providing the first metal interconnect 28 of the first layer. Since the rest of the constitution is similar to that of FIGS. 4A, 4B, description of the rest is omitted.

In such a constitution, the control gate electrode 26 (word line WL) is connected with the output node of the row decoder shown in FIG. 2 through the diffused layer 27, the metal interconnect 28b of the first layer, and the metal interconnect 31 of the second layer. Besides, a part of the control gate electrode 26 in a connecting route between the metal interconnects 28b, 31 respectively of the first and second layers, and the control gate electrode 26, is electrically connected with the n-type layer 27 formed in the p-type semiconductor substrate 21.

As shown in FIG. 5A, a position where the contact hole 30, which communicates the metal interconnect 28b of the first layer with the diffused layer 27, and which is formed in the interlayer insulating film, is located and a position where the direct contact is formed between the control gate electrode 26 and diffused layer 27 are different from each other. Therefore, as shown in the equivalent circuit of FIG. 5B, a resistance R, which is caused by the diffused layer 27, is inserted in addition to the junction diode D1 in a similar way to the case of FIG. 4B.

Accordingly, an effect obtained in the device shown in FIG. 5 is similar to the device shown in FIG. 4.

Figure 6:
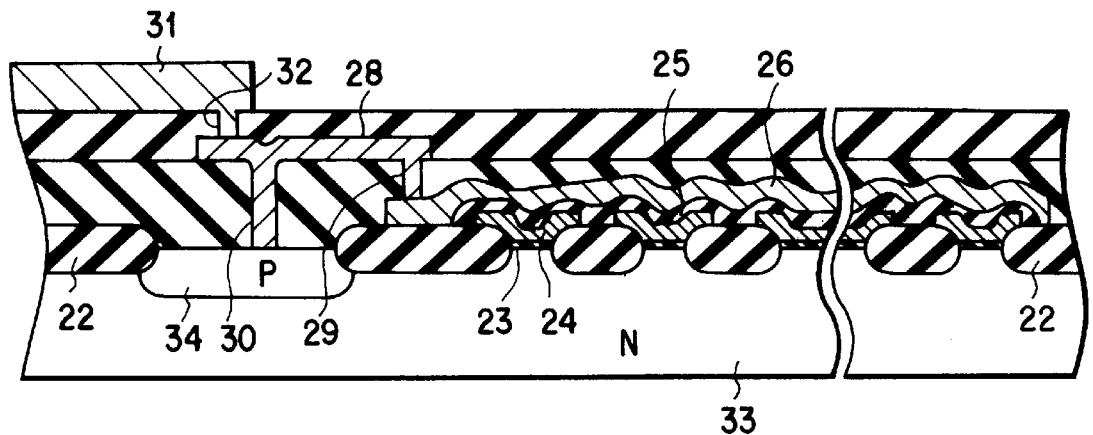
FIG. 6 is a sectional view according to a fourth embodiment of the present invention a row of memory cells and a control gate electrode of a non-volatile semiconductor memory device of FIG. 2.

FIG. 6 is a sectional view showing a row of memory cells MC and a control gate electrode (word line WL), which is connected with the memory cells MC in a common continuity, of a non-volatile semiconductor memory device of FIG. 2.

Points at which a device according to this embodiment is different from that shown in FIGS. 3A, 3B are that a semiconductor substrate 33 having an n-type conductivity (or a well region 33 having an n-type conductivity formed in a p-type semiconductor substrate) is used instead of the semiconductor substrate 21 having a p-type conductivity, in accompanying with this, source and drain regions of a memory cell are constructed with a diffused layer having a conductivity reverse to that of the substrate (or well region), that is with a diffusion layer having a p-type conductivity and a p-type diffused layer 34 is formed in the semiconductor substrate (or well region) 33 in order to let a charging current, which is produced when fluctuation of a plasma occurs in RIE to flow away. Since the other parts of the constitution are similar to the case of FIGS. 3A, 3B, description on the other parts are omitted.

According to this embodiment, since the n-type semiconductor substrate (or well region) 33 and the p-type diffused layer 34 constitutes a junction diode, a charging current with a positive polarity, which is generated when fluctuation of a plasma occurs in RIE for boring the via-hole 32 in the second interlayer insulating film, said via-hole 32 communicating with the metal interconnect 28 of the first layer, is let to flow away to a predetermined potential at which the semiconductor substrate (or well region) 33 is set. As a result, a high voltage caused by the fluctuation of a plasma is not imposed on the control gate electrode of each memory cell MC and thereby a breakdown in a gate insulating film, especially the first gate insulating film 23 as thin as in the range of 10 nm to 15 nm present between the floating gate electrode 24 and substrate (channel region), can be prevented.

Figure 7:
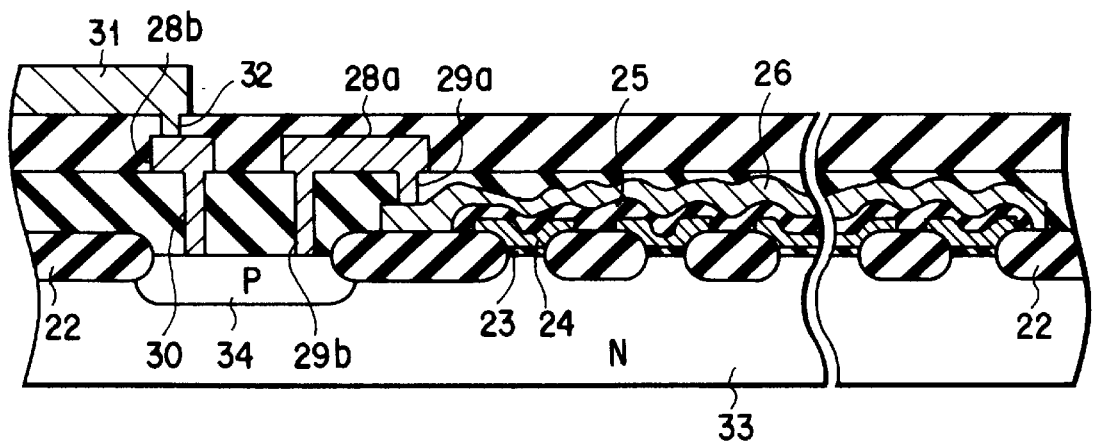
FIG. 7 is a sectional view showing a row of memory cells and a control gate electrode of a non-volatile semiconductor memory device of FIG. 2 according to a fifth embodiment of the present invention.

FIG. 7 is a sectional view a row of memory cells and a control gate electrode (word line WL), which is connected with the memory cells in a common continuity, of a non-volatile semiconductor memory device of FIG. 2.

Points at which a non-volatile semiconductor memory device of this embodiment is different from the non-volatile semiconductor memory device of FIGS. 4A, 4B are that a semiconductor substrate 33 having an n-type conductivity (or a well region 33 of an n-type conductivity formed in a p-type semiconductor substrate) is used instead of the semiconductor substrate 21 having a p-type conductivity, in accompanying with this, source and drain regions to be formed in each element region mentioned above are constructed with a diffused layer of a conductivity contrary to the substrate (or well region), that is a p-type conductivity, and a p-type diffused layer 34 is formed in the semiconductor substrate (or well region) 33 in order to let a charging current produced when fluctuation of a plasma occurs in RIE. Since the other parts of the constitution is similar to the case of FIGS. 4A, 4B, description on the parts is omitted.

According to the non-volatile semiconductor memory device of this embodiment, since the n-type semiconductor substrate (or well region) 33 and a p-type diffused layer 34 constitute a junction diode, a charging current produced when fluctuation of a plasma occurs in RIE for boring the via-hole in the second interlayer insulating film, said via-hole 32 communicating with the metal interconnect 28b of the first layer, is let to flow away through the junction diode to a predetermined potential at which the n-type semiconductor substrate (or well region) 33 is fixed. As a result, a high voltage, produced when fluctuation of a plasma occurs in RIE, is not imposed on the control gate electrode of each memory cell MC and thereby a breakdown in a gate insulating film, especially the first gate insulating film 23 as thin as in the range of 10 to 15 nm, present between the floating gate electrode 24 and substrate (channel region), can be prevented.

Figure 8:
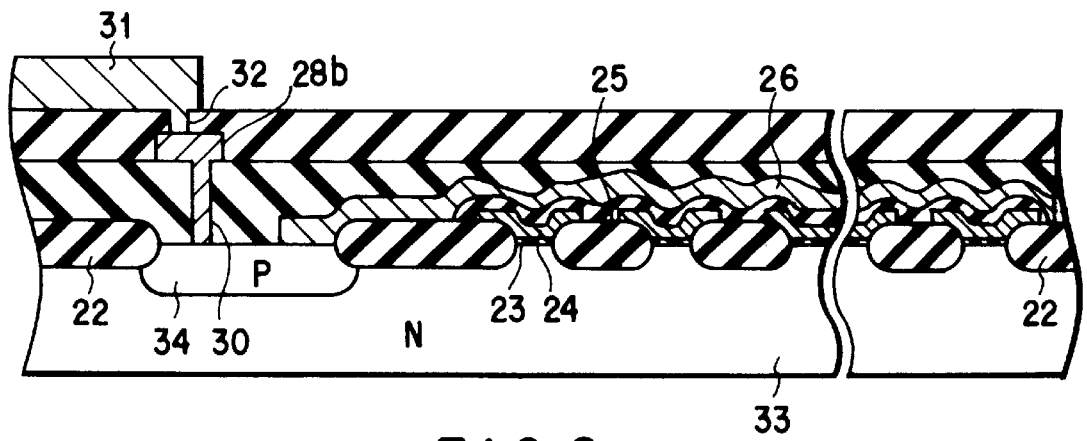
FIG. 8 is a sectional view showing a row of memory cells and a control gate electrode of a non-volatile semiconductor memory device of FIG. 2 according to a sixth embodiment of the present invention.

FIG. 8 is a sectional view of a row of memory cells MC and a control gate electrode (word line WL), which is connected with the memory cells MC in a common continuity, of a non-volatile semiconductor memory device of FIG. 2.

Points at which a non-volatile semiconductor memory device of this embodiment is different from that of FIGS. 5A, 5B are that a semiconductor substrate 33 having an n-type conductivity (or a well region 33 of an n-type conductivity formed in a p-type semiconductor substrate) is used instead of the semiconductor substrate 21 having a p-type conductivity, in accompanying with this, source and drain regions to be formed in each element region mentioned above are constructed with a diffused layer of a conductivity contrary to the substrate (or well region), that is a p-type conductivity, and a p-type diffused layer 34 is formed in the semiconductor substrate (or well region) 33 in order to let a charging current produced when fluctuation of a plasma occurs in RIE. Since the other parts of the constitution is similar to the case of FIGS. 5A, 5B, description on the parts is omitted.

According to the non-volatile semiconductor memory device of this embodiment, since the n-type semiconductor substrate (or well region) 33 and a p-type diffused layer 34 constitute a junction diode, a charging current of a positive polarity produced when fluctuation of a plasma occurs in RIE in process where a via-hole 32, which is communicated with the metal interconnect 28b of the first layer, is bored in the second interlayer insulating film, is let to flow away through the junction diode to a predetermined potential at which the n-type semiconductor substrate (or well region) 33 is fixed. As a result, a high voltage, produced by fluctuation of a plasma, is not imposed on the control gate electrode of each memory cell MC and thereby a breakdown in a gate insulating film, especially the first gate insulating film 23 as thin as in the range of 10 to 15 nm, present between the floating gate electrode 24 and substrate (channel region), can be prevented.

In above mentioned FIGS. 3A, 3B to FIG. 8, a diffused layer of a conductivity contrary to the substrate (or well region) is formed in the substrate (or well region), a part at an arbitrary point in a connecting route between the output node of the row decoder and the control gate electrode is connected with the diffused layer and thereby a charging current of either a positive or negative polarity produced when fluctuation of a plasma occurs is let to flow away. Instead, there may be employed such a constitution that diffused layers respectively of the same conductivity as and contrary conductivity to the substrate (or well region), that is of both types of conductivity, are provided in the substrate (or well region), and a part at an arbitrary point in a connecting route between the output node of the row decoder and control gate electrode is connected with a diffused layer, so that charging currents respectively of a positive polarity and a negative polarity, which are produced when fluctuation of a plasma occurs in RIE, both are let to flow away.

Figure 9:
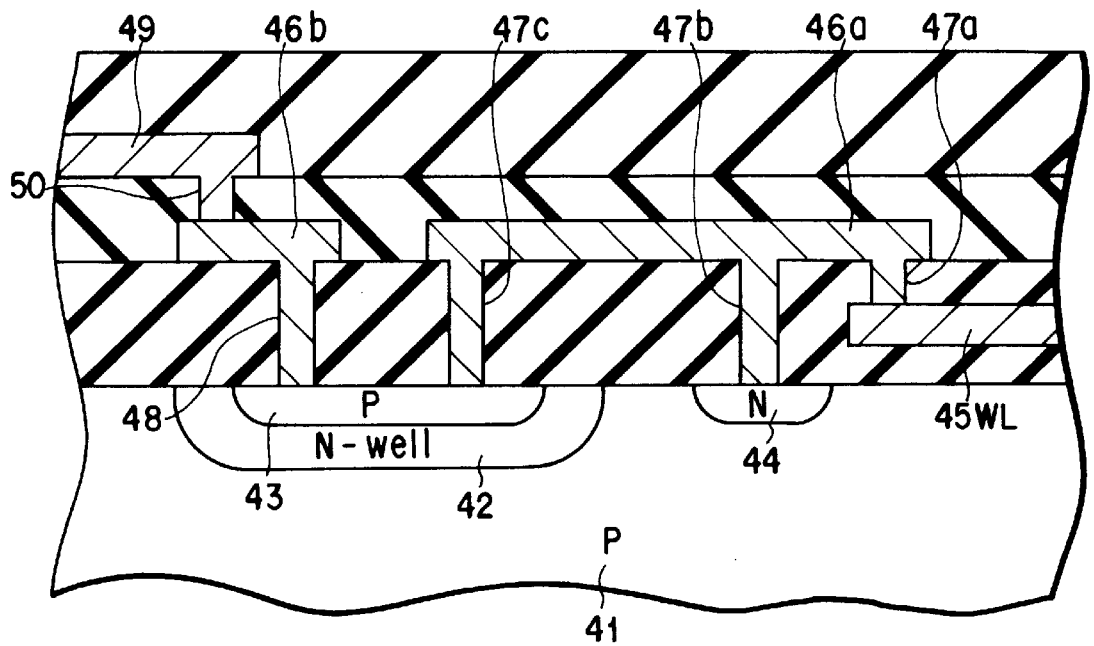
FIG. 9 is a sectional view of a semiconductor device according to a sixth embodiment of the present invention.

In a non-volatile semiconductor memory device of FIG. 9, charging currents of positive and negative polarities both are let to flow away. That is, an n-well region 42 is formed in the p-type semiconductor substrate (or p-type well region) 41. A p-type diffused layer 43 is formed in the n-well region 42 and an n-type diffused layer 44 is formed in the p-type semiconductor substrate (or p-type well region) 41. 45 indicates a control gate electrode (word line WL) which corresponds to the control gate electrode 26 (word line WL) in FIGS. 3A, 3B to 8, and a metal layer of a first layer, for example metal interconnects 46a, 46b of a first layer made of aluminum, are formed on the control gate electrode 45 with an interlayer insulating film interposing therebetween.

The metal interconnect 46a of the first layer, is electrically connected with the control gate electrode 45 through a first hole 47a formed in the interlayer insulating film, besides, electrically connected with a surface of the n-type diffused layer 44 through a second hole 47b formed in the interlayer insulating film and further electrically connected with a surface of the p-type diffused layer 43 through a third contact hole 47c formed the interlayer insulating film.

A metal interconnect 46b of the first layer is electrically connected with the surface of a part of the p-type diffused layer 43 different from the connecting part between the metal interconnect 46a and p-type diffused layer 43 through a contact hole 48 formed in the interlayer insulating film.

A metal layer of a second layer, for example, a metal interconnect 49 of a second layer made of aluminum is formed above the metal interconnects 46a, 46b through a second interlayer insulating film. The metal interconnect 49 is electrically connected with the second metal interconnect 46b through a via-hole 50 formed in the second interlayer insulating film. Besides, the metal interconnect 49 of the second layer, is connected with the output node of a row decoder in FIG. 2.

According to a non-volatile semiconductor memory device of FIG. 9, the control gate electrode 45 (word line WL) is connected with the output node of the row decoder shown in FIG. 2 through the metal interconnects 46a, 46b, 49, the former two of which are the first layer and the latter 49 of which is the second layer, and the diffused layers 43, 44, and besides parts of the metal interconnects 46a,46b of the first layer, in a connecting route between the metal interconnects 46a, 46b, 49 and the control gate electrode 45 are electrically connected with the p-type diffused and n-type diffused layers respectively.

In a RIE step, the p-type semiconductor substrate (or p-well) 41 is fixed at the ground potential and the n-well region is fixed at a positive potential.

According to a semiconductor device of this embodiment, a charging current of a positive polarity produced when fluctuation of a plasma occurs in RIE for the second interlayer insulating film is let to flow away to the ground potential through a junction diode constituted from the p-type diffused layer 43 and n-well region 42 and a charging current of a negative polarity is let to flow away to a positive potential by a junction diode constituted from the n-type diffused layer 44 and p-type semiconductor substrate (or p-well region) 41.

That is, according to the semiconductor device of this embodiment, a breakdown in the first gate insulating film of each memory cell MC can be prevented even when charging currents of positive and negative polarities are produced by fluctuation of a plasma.

In the non-volatile semiconductor memory device of this embodiment, while the metal interconnects 46a, 46b both of the first layer, are isolated from each other, the contact holes 47c, 48 communicating the metal interconnects 46a, 46b with the p-type diffused layer 43 are formed at different positions from each other and a resistance is inserted between the metal interconnects 46a, 46b using the diffused layer 43, such a constitution may be employed that the metal interconnect 46 is not divided and isolated and only one contact hole through which it connects with the p-type diffused layer is provided so as to have the metal interconnects 46a, 46b in a common continuity. On the other hand, such another constitution may be employed that the contact hole 47b communicating the metal interconnect 46a of the first layer and n-type diffused layer 44 is divided into two of the kind located in different positions from each other and further a resistance using an n-type diffused layer is inserted between two positions space apart from each other in the metal interconnect of the first layer.

In FIGS. 3A, 3B to 9, there has been given the description that an end of each control gate electrode (word line WL) is disconnected at a position where no memory cell is present and nothing is connected with the end beyond it, a constitution may be employed in which it is connected with a substrate or well region through a diffused layer in a similar way to the other end depending on a pattern layout. Thus, an effect that a breakdown in the first gate insulation film between the floating gate electrode and substrate (channel region) is prevented can be heightened.

The present invention has been described about the cases where non-volatile semiconductor memory devices of having transistors of a double gate structure are executed in the above mentioned embodiments. The present invention, however, is not restricted to the non-volatile semiconductor memory device and it can apparently be executed in applications of a semiconductor device comprising transistors with a multilayer metal interconnection structure and single layer gate electrode structure, such as static random access memory (SRAM), dynamic random access memory (DRAM), and a logic circuit and the like.

Figure 10:
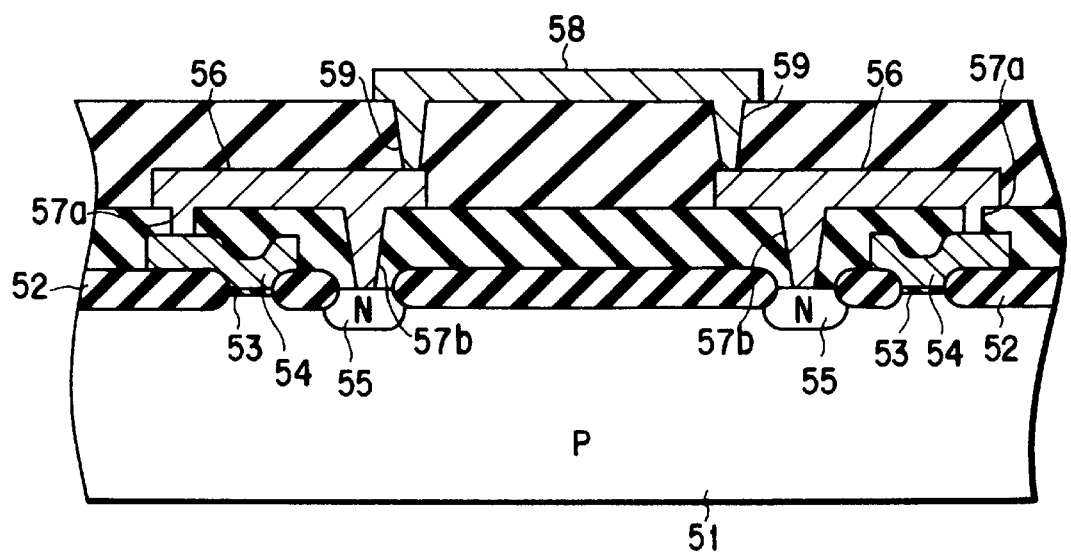
FIG. 10 is a sectional view of a semiconductor device according to a seventh embodiment of the present invention.

FIG. 10 is a sectional view of a semiconductor device comprising transistors with a double-metal-interconnection structure and single layer gate electrode structure on which the present invention is executed. For the sake of convenience in description, only two transistors are shown in the figure, but it is needless to say that there are actually provided with many of transistors.

A field insulating film 52 is formed on a semiconductor substrate 51 having a p-type conductivity. Each element region surrounded by the field insulating film 52 has a gate electrode 54 deposited thereon, said gate electrode 54 being constituted from a gate insulating film 53 of a transistor and a polycrystal silicon.

Source and drain regions constructed with a diffused layer having a conductivity contrary to that of the substrate, that is an n-type conductivity, are formed and each gate electrode 54 is located on a channel region between the source and drain region. A diffused layer 55 having a conductivity reverse to the substrate, that is an n-type conductivity is formed on a major surface of the substrate 51. The n-type diffused layer 55 may be formed together with the source and drain regions when they are formed or in a step before or after they are formed.

A metal layer of a first layer, for example a metal interconnect 56 of a first layer made of aluminum, is formed above each gate electrode 54 with an interlayer insulating film interposing therebetween. The metal interconnect 56 is electrically connected not only with the gate electrode 54 through a contact hole 57a formed in the interlayer insulating film, but also electrically connected with a surface of the diffused layer 55 through a another contact hole 57b formed in the interlayer insulating film.

Besides, a metal layer of a second layer, for example, a metal interconnect 58 of a second layer made of aluminum, on the metal interconnect 56 with a second insulating film interposing therebetween and the metal interconnect 58 is electrically connected with the metal interconnect 56 through a via-hole 59 formed in the second interlayer insulating film.

In the semiconductor device of such a constitution, the metal interconnects 56, 58 respectively of the first and second layers, and the gate electrode 54 of a transistor are mutually connected and a part of the metal interconnect 56 of the first layer is electrically connected with the n-type diffused layer 55 formed in the p-type semiconductor substrate 51. The substrate 51 is fixed at the ground potential when RIE is conducted to bore the via-hole 59 in the second interlayer insulating film.

In such a constitution, a charging current with a negative polarity produced when fluctuation of a plasma occurs in RIE for boring the second interlayer insulating film to form the via-hole 59 communicating with the metal interlayer 56 of the first layer, is let to flow away to the ground potential at which the p-type substrate 51 is fixed through a junction diode constituted from the n-type diffused layer 55 and p-type substrate 51. As a result, a high voltage caused by fluctuation of a plasma is not imposed on the gate electrode of each transistor and thus a breakdown in the gate insulating film 53 can be prevented.

The present invention is not restricted to the embodiments mentioned above, but it is needless to say that a variety of modifications thereof can be made. For example, In the above mentioned embodiments, the cases where metal interconnection above a control gate electrode or gate electrode comprises two layers of interconnects have been described, but it is needless to say that a semiconductor device with a multilayer interconnection structure comprising metal interconnection of more than two layers can be executed with ease.

As described above, in a semiconductor device having a multilayer metal interconnection structure according to the present invention, a breakdown in a gate insulating film by a charging damage occurring in a RIE process step for formation a contact hole in an interlayer insulating film can be prevented, said contact hole being used for mutually connecting metal interconnects with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:
   a first semiconductor region of a first conductivity type;
   a transistor having diffusion regions of a second conductivity type which are formed in said first semiconductor region as source and drain regions, and including a gate electrode provided on a channel region located between said source and drain regions with an insulating film interposing therebetween;
   interconnects of at least two layers, which are made of conductive layers above said gate electrode and which are electrically connected with each other; and
   a second semiconductor region of a second conductivity type formed in said first semiconductor region and separated from the source and drain regions of said transistor, said second semiconductor region and said first semiconductor region constituting a diode, said second semiconductor region being isolated from said source and drain regions by a device isolation insulating film, and said second semiconductor being electrically connected to one of said at least two layers and said gate electrode.

2. A semiconductor device according to claim 1, wherein said gate electrode is connected to said second semiconductor region via one of said two layers.

3. A semiconductor device according to claim 1, wherein said gate electrode is directly connected to said second semiconductor region.

4. A semiconductor device according to claim 1, wherein a thickness of said insulating film of said transistor is in the range of 10 nm to 15 nm.

5. A semiconductor device comprising:
   a first semiconductor region of a first conductivity type;
   a memory cell array wherein said memory cell array includes a plurality of transistors each of which have diffusion regions of a second conductivity type formed in said first semiconductor region as source and drain regions and a gate electrode provided on a channel region located between source and drain regions with an insulating film interposed therebetween, the transistors are arranged in rows and columns each as a memory cell, and gate electrodes of memory cells in the same row are connected with each other so as to be all in common continuity and work as a word line;
   interconnects of at least two layers, which are made of conductive layers above said gate electrode and which are electrically connected with each other; and
   a second semiconductor region of a second conductivity type formed in said first semiconductor region and separated from the source and drain regions of said transistor, said second semiconductor region and said first semiconductor region constituting a diode, said second semiconductor region being isolated from said source and drain regions by a device isolation insulating film, and said second semiconductor being electrically connected to one of said at least two layers and said gate electrode.

6. A semiconductor device according to claim 5, wherein said word line is connected to said second semiconductor region via one of said two layers.

7. A semiconductor device according to claim 5, wherein said word line is directly connected to said second semiconductor region.

8. A semiconductor device according to claim 5, wherein a thickness of said insulating film of said transistor is in the range of 10 nm to 15 nm.

9. A semiconductor device comprising:

a first semiconductor region of a first conductivity type;

a memory cell array wherein said memory cell array includes a plurality of transistors each of which includes diffusion regions of a second conductivity type formed in said first semiconductor region as source and drain regions, a floating gate electrode provided on a channel region located between source and drain regions with a first insulating film interposed therebetween, and a control gate electrode provided on the floating gate electrode with a second insulating film interposed therebetween, the transistors are arranged in rows and columns each as a memory cell, and gate electrodes of memory cells in the same row are connected with each other so as to be all in common continuity and work as a word line;

interconnects of at least two layers, which are made of conductive layers above said gate electrode and which are electrically connected with each other; and a second semiconductor region of a second conductivity type formed in said first semiconductor region and separated from the source and drain regions of said transistor, said second semiconductor region and said first semiconductor region constituting a diode, said second semiconductor region being isolated from said source and drain regions by a device isolation insulating film, and said second semiconductor being electrically connected to one of said at least two layers and said gate electrode.

10. A semiconductor device according to claim 9, wherein said word line is connected to said second semiconductor region via one of said two layers.

11. A semiconductor device according to claim 9, wherein said word line is directly connected to said second semiconductor region.

12. A semiconductor device according to claim 9, wherein a thickness of said insulating film of said transistor is in the range of 10 nm to 15 nm.

* * * * *